United States Patent
Macaluso

(10) Patent No.: US 7,411,431 B2
(45) Date of Patent: Aug. 12, 2008

(54) DUAL OUTPUT DIFFERENTIAL LINE DRIVER USING SINGLE CURRENT

(75) Inventor: Steven Mark Macaluso, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 156 days.

(21) Appl. No.: 11/347,916

(22) Filed: Feb. 6, 2006

(65) Prior Publication Data

US 2007/0182460 A1   Aug. 9, 2007

(51) Int. Cl.
    *H03B 1/00* (2006.01)
(52) U.S. Cl. .......................... 327/112; 327/52; 327/63
(58) Field of Classification Search ............... 327/108, 327/109, 111, 112, 52, 63, 65; 326/68, 83, 326/87
    See application file for complete search history.

(56) References Cited

U.S. PATENT DOCUMENTS

| | | | | |
|---|---|---|---|---|
| 5,196,742 A * | 3/1993 | McDonald | ................... | 327/65 |
| 5,642,071 A * | 6/1997 | Sevenhans et al. | .......... | 327/359 |
| 6,111,431 A * | 8/2000 | Estrada | ....................... | 326/83 |
| 6,600,346 B1 * | 7/2003 | Macaluso | ................... | 327/108 |
| 6,700,403 B1 * | 3/2004 | Dillon | ......................... | 326/37 |
| 6,777,988 B2 * | 8/2004 | Tung et al. | ................... | 327/115 |
| 6,801,969 B2 | 10/2004 | Crafts et al. | | |
| 6,980,054 B2 * | 12/2005 | Okada | ......................... | 330/257 |
| 7,215,157 B2 * | 5/2007 | Aoike | .......................... | 327/63 |
| 2004/0174993 A1 | 9/2004 | Russell | | |

FOREIGN PATENT DOCUMENTS

| | | |
|---|---|---|
| DE | 102005005538 A1 | 2/2005 |
| EP | 1017196 A2 | 7/2000 |
| WO | 2005071908 A1 | 8/2005 |

OTHER PUBLICATIONS

Gabara, Thaddeus, Phantom Mode Signaling in VLSI Systems, Advanced Research In VLSI, 2001, Mar. 14, 2001, pp. 88-100, Piscataway, NJ.

* cited by examiner

*Primary Examiner*—N. Drew Richards
*Assistant Examiner*—Hai L. Nguyen
(74) *Attorney, Agent, or Firm*—Cesari and McKenna, LLP; Edwin H. Paul, Esq.

(57) ABSTRACT

Box switches are stacked sharing a common current from power sources. The power sources may be current, voltage or a combination of such sources. In preferred embodiments, the transistor switches in the box switches may be paralleled by different polarity transistors that will act to better balance and make symmetrical the output signals. Capacitors may be used to smooth out residual noise voltage signals.

9 Claims, 3 Drawing Sheets

DUAL OUTPUT DIFFERENTIAL LINE DRIVER USING SINGLE CURRENT

BACKGROUND OF THE INVENTION

1. Field of the Invention

The present invention relates to differential transmission line drivers and more particularly to such drivers with a differential input and a differential output.

2. Background Information

FIG. 1 illustrate a box switch configuration 2 of four MOSFET's used by practitioners to drive transmission lines, logic system, motors, and other items where a full reversal of current through or logic levels across a load is advantageous. In particular when transferring logic data between systems or otherwise over transmission lines, FIG. 1 shows a box configuration for differentially transferring an input differential clock signal, CLK+, and CLK−, to a differential VOCLK signal sent over a transmission line that is terminated (and presumably matched) with a resistor, RL CLK. A similar box configuration is used to differentially transfer differential data, DATA+, DATA−, over another transmission line terminated with a resistor, RL DATA. The two transmission lines are in parallel, and, at the receiver, the clock signal is used to gate or strobe the data received into registers.

Briefly, operation of the schematic 2 will be described, and those skilled in the art will understand the operation of the box switch used for transmitting a clock signal VOCLK. Consider Vdd as a positive voltage source and Vss as ground. If CLK+ is high and CLK− low, M2 and M3 will be on and M1 and M4 will be off. Location 4 will be driven towards Vss via M2 and location 6 will be driven towards Vdd via M3. Current will flow from Vdd through M3, through the transmission line to RLCLK to location 4 and through M2 to Vss. Location 6 will be at a higher potential than will location 4. When CLK+ goes low and CLK− goes high, M1 and M4 will be on and M2 and M3 will be off. Here current will flow through RLCLK in the opposite direction and location 4 will be at a higher potential than will location 6. This full logic reversal basically doubles the signal compared to driving a single ended clock through the transmission line.

The operation of the circuit 2 for data is similar to the description above.

Since there are two circuits, one for data and one for the clock in FIG. 1, the power dissipated is double that for one such circuit. In some prior art configurations for a single box switch, a current source may be used in place of a voltage source. (Id is shown replacing Vdd, but it may, instead, replace Vss.) If a current or voltage power source Is used, as known to those skilled in the art, the voltage compliance of the sources and devices must allow for proper logic operation of the box switches and signal levels at the clock and data inputs and at the receiving ends of the transmission lines.

SUMMARY OF THE INVENTION

The present invention addresses limitations of the prior art while embodiments of the present invention are directed to achieving other advantages.

The present invention advantageously realizes that the differential nature of the prior art, as illustrated in FIG. 1, suggests that a constant current flows through each of the box switches irrespective of the current path. With respect to the circuit of FIG. 1, the two clock inputs, CLK+ and CLK−, and the two data inputs, DATA+ and DATA−, are logic level opposites, they cannot be at the same logic level. So, the outputs on both transmission lines persist at a differential logic level with current flowing through both box switches. It follows that there is always current through the transmission lines.

If the electronic receivers at the end of the transmission lines are differential receivers, a common mode voltage on the transmission lines will (within known design practices) not interfere with the receipt of the differential signal With the above descriptions in mind, the circuit of FIG. 1 may be stacked one on top of the other and electrically connected so that they share the same current, as in FIG. 2. That is the current from Vdd traverses the top clock box switch and the bottom data box switch. Both the clock and the data differential signals will be transmitted from the stacked circuits. In preferred embodiments, any number of circuits may be stacked sharing current within the voltage compliance and other such implementation considerations involved in specific embodiments and applications.

When stacked, as illustrated in FIG. 2, the current that flows through both top and bottom box switches. The power dissipated, compared to the circuits of FIG. 1, is halved. Another advantage of the present invention is that the constant current flowing through the stacked box switches provides a "natural" voltage level for each location in the stacked circuit. That is, any one path through the stacked switches and transmission line terminations will have an equal number of matched components (assuming they are fabricated on the same chip under the same conditions) with voltage drops. Therefore the current drawn will be substantially constant regardless of the path through the box switch. So the voltages through the circuit will remain substantially the same regardless of the path. Even the high voltage levels and the low logic levels on the clock and data outputs will be substantially equal each other. These conditions are advantageously achieved without feedback or other additional circuitry.

In preferred embodiments, other MOSFET's may be placed in parallel with those found in a box switch, to enhance balance and symmetry of the clock and data output signals.

Another advantage of the stacked box switches is low noise due to the smaller current and output voltage signals due to the additional box switch in the current path.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF ILLUSTRATIVE EMBODIMENTS

Figure 1:
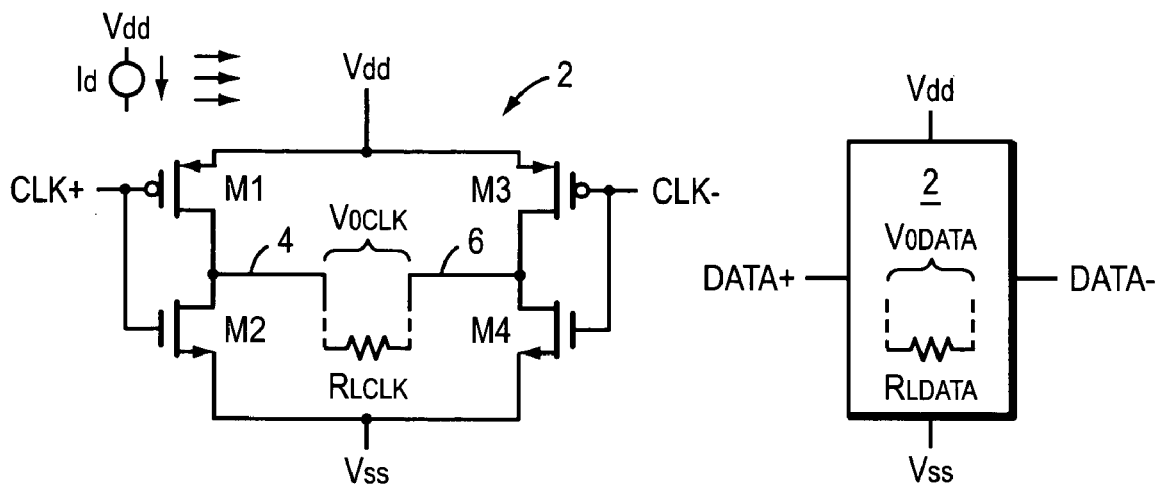
FIG. 1 is a schematic of a known box switch.
Figure 2:
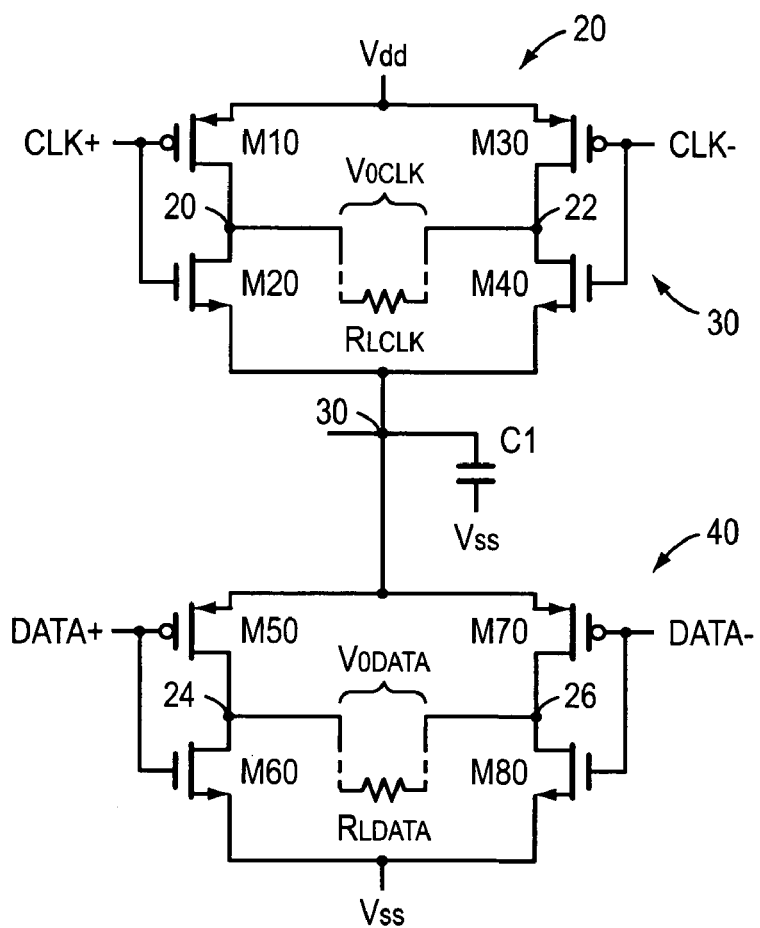
FIG. 2 is a schematic of a circuit employing the present invention.

FIG. 2 illustrates two stacked box switch circuits sharing the supply current. Here Vdd is a positive potential, for example +2.8 volts, and Vss is ground. Say CLK+ is at logic one, +2.8V, and CLK− is at logic zero, ground. Consider DATA+ at logic one and DATA− at zero. In this condition M30, M20, M70 and M60 are biased on and conducting. In one embodiment these transistors will all be exactly the same size and all will demonstrate identical on resistances and so will drop identical voltages. The current path will be from location 22 to location 20 through the line terminating resistance RL CLK, and then from location 26 to location 24 through the RLDATA terminating resistance. Consider the two terminating resistances to be equal and proper terminations for the transmission lines involved. If the current is 1 ma and the terminating resistances are 100 ohms, the drops across the resistors will be 100 mV each and each of the four "on" transistors would be dropping 0.650 mV (due to the small size of these specific transistors). Of course, other transistors and terminating resistors may be used and will demonstrate different voltage drops.

Note that location 22 will be at +2.8−0.650, or +2.150V, and location 20 will be at +2.050V, and location 26 will be at 0.65+0.100, or +0.750V, and location 24 will be at +0.650V. So there will be a common mode voltage at the clock receiver of +2.150V and one of +0.650V at the data receiver. Others might average the two levels for the common mode level since the signals reverse, but, either way, the point is that receivers can be designed to be substantially unresponsive to common mode signals.

As mentioned above, there is a natural voltage action inherent in the circuit of FIG. 2. Location 20 maintains one of these natural voltages, but a capacitor C1 is provided to minimize any switching noise. As discussed above, the current through the clock box switch 30 is substantially independent of the path so the voltage at location 20 remains constant. However, the current may be switched through the transistors. Since there may be some unsymmetrical switching times due to thresholds and inherent capacitances noise will manifest and C1 helps minimize any such effects. Another benefit of the stacking occurs since any switching noise will be maximum when both the clock and data lines are changing logic states and minimum when only the clock (or the data) is changing. However, since the clock edge that will be used to strobe in the data at the receiver will be the clock edge where the data is constant, noise generated is the minimum. This is important where many data lines are synchronized with only one clock signal.

Figure 4:
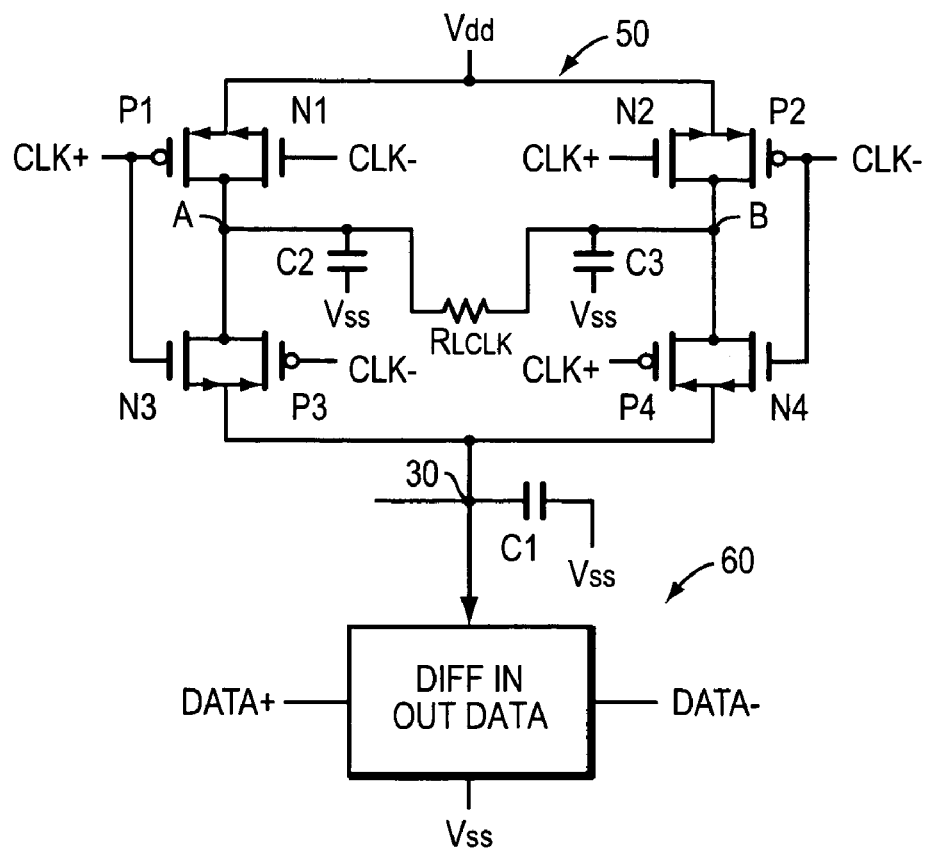
FIG. 4 is a schematic of an embodiment of the present invention.

FIG. 4 illustrates another embodiment that addresses the unsymmetrical switching by paralleling transistors with other polarity types. FIG. 4 shows one box switch 50, where P1, N3, P2, and N4 represent a standard box switch as shown as item 30 in FIG. 2. When CLK+ switches from high to low P1 turns on. At the same time CLK− goes high turning on N1. Both P1 and N1 act to drive point A high. Correspondingly, CLK− going high will drive P2 off and CLK+ going low will drive N2 off. Similar operation occurs for the N3/P3 combination and the N4/P4 combination. The point of the parallel transistors, and the fact that the added N1, N2, P3 and P4 are "upside down," as shown, are to make the switching actions more symmetrical and balanced. For example, if P1 and N1 are turning on and driving an increasing current through to point A and N4 and P4 are turning on sinking the identical increasing current from point B; and the decreasing current from P/N2 and N3/P3 also matches exactly, the current into point 30 remains transiently constant as does the current out of the Vdd supply. The parallel transistors are designed to provide these symmetrical balanced operations. In other embodiments the parallel transistors may be "right side up." In addition, since the balance described above will not be so perfect, C2 and C3 are added to help the signal symmetry by absorbing excess charge during the switching transients. For example, C1 may be a few tens of picofarads, and C2 and C3 may be a few picofarads. A second box switch 60, is a duplicate of 50 except that the signals in are DATA+ and DATA−, the output is a differential data signal, and point 20 passes all the current into 60 and Vss is the current sink.

As known to those skilled in the art, the circuit in FIG. 4 could be arranged with a current source replacing the connection to Vdd, or a current source may replace the Vss connection.

Figure 3:
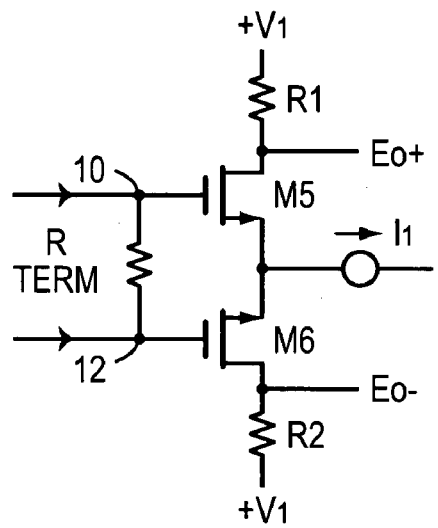
FIG. 3 is a schematic of a possible differential receiver.

As known in the art, FIG. 3 shows a rudimentary differential receiver that is impervious to common mode signals. If location 10 is high compared to location 12, M5 will be on and M6 will be off. I1 will flow through M5 and EO+ will be V1 minus the voltage drop of I1(R1). Similarly, EO− will be at V1. If location 12 is higher than 10, M6 will be on and M5 off, and EO− will be a V1−I1(R2), and EO+ will be at V1. The common mode voltage of locations 10 and 12 will not change the operation as long as the magnitude does not interfere with the describe operations of the EO's. As mentioned above, those skilled in the art will understand the issues involved.

Figure 5:
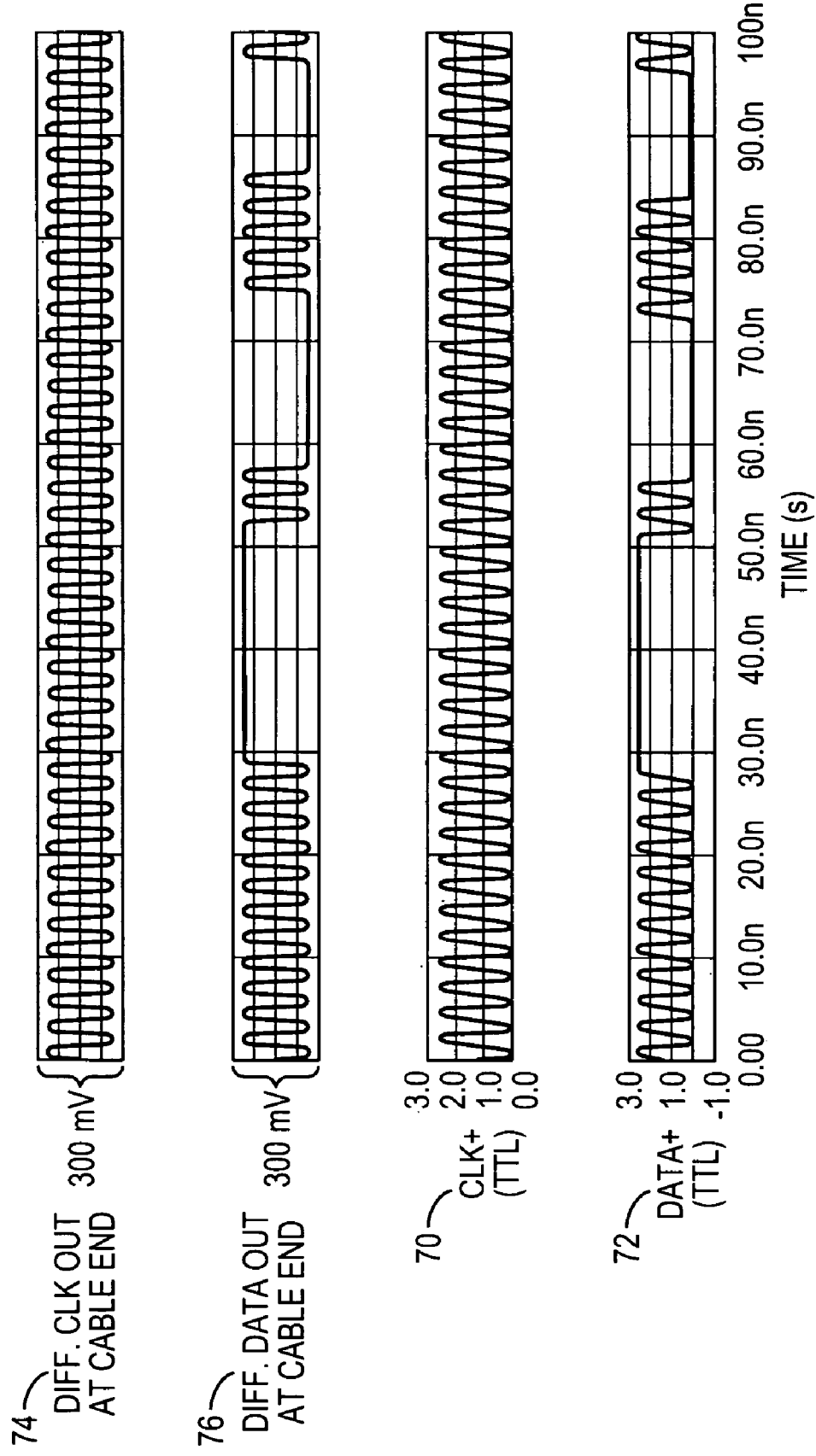
FIG. 5 is chart of signals found in the circuit of FIG. 4.

FIG. 5 shows graphs or the signals found using the circuit of FIG. 4. The CLK+ signal 70 and the DATA+ signal 72 illustrate TTL clock and data signal traveling together over a transmission cable or line, as described above. However, virtually any signal that meets the circuitry constraints can be used for inputs. The DIFF. CLK OUT and the DIFF. DATA OUT are composites of the differential outputs at the end of the cable. That is the difference between the positive and the negative signals is shown in one trace for each of these signals. In one preferred embodiment using a Vdd of +2.8 volts and Vss of ground, the received differential signals are 300 mV with the transistor switches exhibiting voltage drops along the signal paths.

Although the preferred embodiment circuitry shown includes P and N type FET's, it should be understood that bipolar transistors, hybrid transistors and other two state-type semiconductor devices may advantageously employ the present invention. Moreover, mixing such different devices may be used to advantage.

Also, the box switches are representative of differential input/differential output circuits. The present invention may be used to advantage with other such circuits.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A circuit having at least at least two differential inputs and at least two corresponding differential outputs, the circuit drawing a current from a power source, the circuit comprising:

a first box switch with a first differential input and a corresponding first differential output, a second box switch with a second differential input and a corresponding second differential output, wherein the first box switch and the second box switch are arranged in series with respect to the power source, wherein the current from the power source runs from the first box switch to a node and then to the second box switch, wherein the first box switch comprises;

a first pair of transistors with their sources coupled together and to the power source, the gates of these transistors each coupled, respectively, to a different input signal of the first differential input signal pair, the drains of these transistors each coupled, respectively, to one of the first differential output signal pair, and a second pair of transistors of opposite polarity to the first pair, the sources of the second pair coupled together and further coupled to the node, the gates of these transistors each coupled, respectively, to one of the gates of the first pair, the drains of these transistors each coupled, respectively, to the drains of the first pair, wherein the transistors with their drains coupled together are the transistors whose gates are coupled together.

2. The circuit of claim 1 further comprising a capacitor coupled from the node to a low impedance node.

3. The circuit of claim 1 wherein the first differential output drives a first matched transmission line and the second differential output drives a second matched transmission line.

4. The circuit of claim 1 further comprising capacitors coupled from the first and the second differential output signals to low impedance nodes.

5. The circuit of claim 1 wherein the first box switch further comprises:
    a fifth pair of transistors of opposite polarity from the first pair, the fifth pair of transistors having their drains and sources coupled to the drains and sources of the first pair,
    a sixth pair of transistors of opposite polarity from the second pair, the sixth pair of transistors having their drains and sources coupled to the drains and sources of the second pair, and
    wherein the gates of any two transistors having their drains and sources coupled together have their gates each coupled, respectively, to a different input signal of the first differential input signal pair.

6. The circuit of claim 5 wherein the drains and sources of the fifth pair of transistors have their drains coupled, respectively, to the sources of the first pair and their sources coupled, respectively, to the drains of the first pair, and further wherein the drains and sources of the sixth pair of transistors have their drains coupled, respectively, to the sources of the second pair and their sources coupled, respectively, to the drains of the second pair.

7. The circuit of claim 1 wherein the second box switch comprises:
    a third pair of transistors with their sources coupled together and further coupled to the node, the gates of these transistors each coupled, respectively, to a different input signal of a second differential input signal pair, the drains of these transistors each coupled, respectively, to one of a second differential output signal pair,
    a fourth pair of transistors of opposite polarity to the third pair, the sources of the fourth pair coupled together and further coupled to the power source, the gates of these transistors each coupled, respectively, to one of the gates of the third pair, the drains of these transistors each coupled, respectively, to the drains of the third pair, wherein the transistors with their drains coupled together are the transistors whose gates are coupled together.

8. The circuit of claim 7, wherein the second box switch further comprises:
    a seventh pair of transistors of opposite polarity from the third pair, the seventh pair of transistors having their drains and sources coupled to the drains and sources of the third pair,
    an eighth pair of transistors of opposite polarity from the fourth pair, the eighth pair of transistors having their drains and sources coupled to the drains and sources of the fourth pair, and
    wherein the gates of any two transistors having their drains and sources coupled together have their gates each coupled, respectively, to a different input signal of the second differential input signal pair.

9. The circuit of claim 8 wherein the drains and sources of the seventh pair of transistors have their drains coupled, respectively, to the sources of the third pair and their sources coupled, respectively, to the drains of the third pair, and further wherein the drains and sources of the eighth pair of transistors have their drains coupled, respectively, to the sources of the fourth pair and their sources coupled, respectively, to the drains of the fourth pair.

* * * * *